United States Patent [19]

Ebihara et al.

[11] 4,229,668

[45] Oct. 21, 1980

[54] TRANSISTOR CIRCUIT HAVING A PLURALITY OF CMOS CIRCUITS

[75] Inventors: Heihachiro Ebihara; Fukuo Sekiya, both of Tokarozawa, Japan

[73] Assignee: Citizen Watch Co., Ltd., Tokyo, Japan

[21] Appl. No.: 916,071

[22] Filed: Jun. 16, 1978

[30] Foreign Application Priority Data

Jun. 24, 1977 [JP] Japan ............................. 52-74513

[51] Int. Cl.² ..................... H03K 3/353; H02J 1/00
[52] U.S. Cl. ............................. 307/304; 368/204; 307/15; 307/279; 307/296 R
[58] Field of Search .................. 307/15, 24, 29, 32, 307/38, 85, 296, 304, 270; 58/23 A, 23 BA, 50 R; 340/761, 811, 813

[56] References Cited

U.S. PATENT DOCUMENTS

| | | | |
|---|---|---|---|
| 3,358,151 | 12/1967 | Haase | 307/15 |
| 3,999,368 | 12/1976 | Yoshida | 58/23 BA |
| 4,013,901 | 3/1977 | Williams | 58/50 R X |
| 4,050,064 | 9/1977 | Hashimoto et al. | 340/811 X |
| 4,061,929 | 12/1977 | Asano | 58/23 BA X |
| 4,094,137 | 6/1978 | Morokawa | 588/23 BA X |

*Primary Examiner*—Larry N. Anagnos
*Attorney, Agent, or Firm*—Sherman & Shalloway

[57] ABSTRACT

A transistor circuit having a plurality of CMOS circuits in which the power circuits of said CMOS circuits constitute a series circuit in which the power source circuits are in series connected to each other and the opposite ends of said series circuit is connected to the opposite ends of an electric battery cell.

8 Claims, 17 Drawing Figures

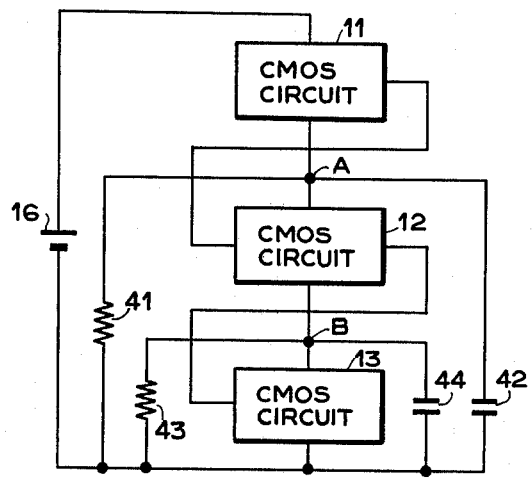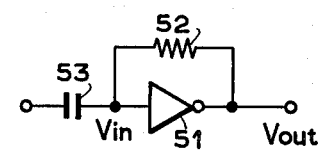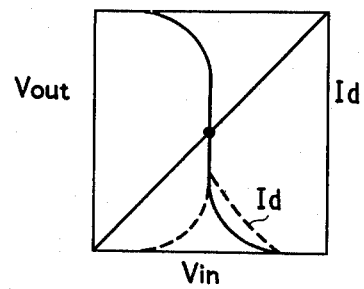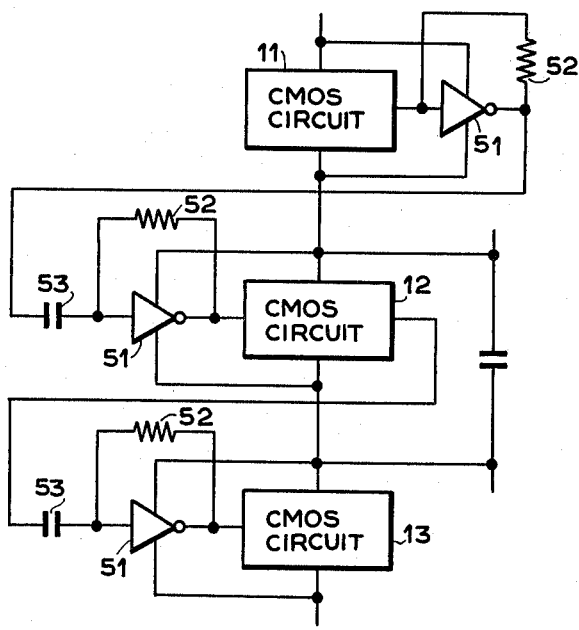
FIG. 7
FIG. 8
FIG. 9
FIG. 10

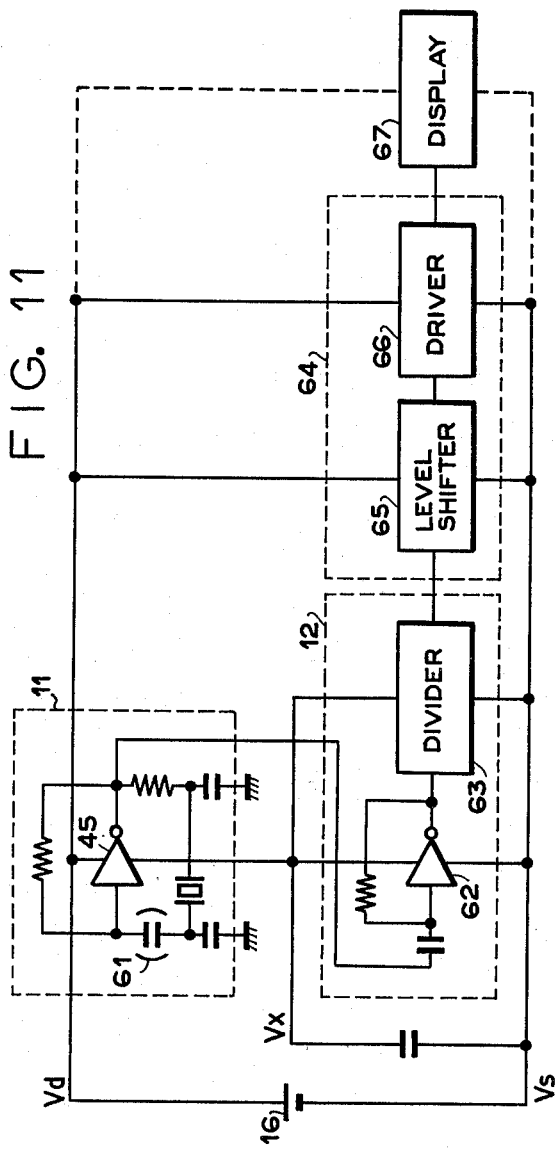
FIG. 11
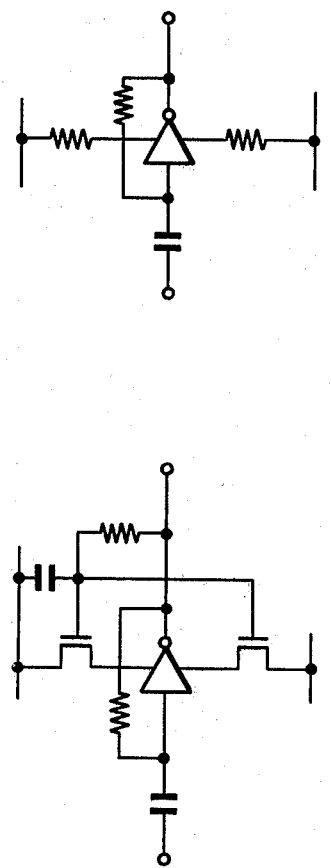
FIG. 12 (a)
FIG. 12 (b)

TRANSISTOR CIRCUIT HAVING A PLURALITY OF CMOS CIRCUITS

BACKGROUND OF THE INVENTION

This invention relates to a transistor circuit which comprises a plurality of insulated gate type complementary metal oxide semiconductor (CMOS) circuits and power source cells for driving these CMOS circuits.

Since the complementary metal oxide semiconductor (CMOS) circuit has the advantage that the circuit consumes only a very small amount of power in operation, the CMOS circuit can be suitably applied to a small size electronic device which is desirably to be operated with a small size cell such as an electronic wrist watch or electronic pocket calculator. The power consumption of the CMOS circuit is generally expressed by the following formula:

$$pd = \Sigma f_n c_n v_n^2 \qquad (1)$$

where $f_n$: operation frequency in node n
$c_n$: capacity in node n
$v_n$: operation voltage in node n For the requirement called for in designing the fundamental circuit arrangement and for the necessity for satisfying conditions necessary to obtain a desired or predetermined operation, the parameters such as $f_n$ and $c_n$ can not be arbitarily varied. Therefore, in order to minimize the power consumption of the CMOS circuit, it has been attempted to reduce the value of $v_n$.

FIGS. 1a, 1b and 1c show prior art transistor circuits which have been known as being capable of attaining the above-mentioned purposes. In each of the prior art transistor circuits illustrated, one power source terminal of the CMOS circuit 1 is connected to one terminal of the cell 2 while the other power source terminal of the CMOS circuit 1 is connected to the other terminal of the cell 2 through a voltage-dropping element 3. In the transistor circuit in FIG. 1a, the voltage drop element 3 comprises a resistor and a smoothing capacitor in parallel connected to the resistor, in the transistor circuit in FIG. 1b, the voltage-dropping element comprises a diode and in the transistor circuit in FIG. 1c, the voltage-dropping element comprises a transistor. In the transistor circuit in FIG. 1c, the transistor is adapted to control the voltage drop amount across the two channels terminals in accordance with a control voltage applied to the gate of the transistor. In each of the three prior art transistor circuits illustrated, the voltage-dropping element 3 acts to reduce the current Ic flowing through the CMOS circuit in accordance with the voltage drop amount $\Delta v$ to thereby realize reduction in power consumption in the CMOS circuit 1. However, since the voltage-dropping element 3 itself consumes an amount of power as represented by $\Delta v \times Ic$, the power consumption saving effect of the overall transistor circuit is not appreciable.

SUMMARY OF THE INVENTION

Therefore, one object of the present invention is to provide a transistor circuit which is capable of reducing power consumption in the CMOS circuit by eliminating unnecessary power consumption.

Another object of the present invention is to provide a transistor circuit in which the power source circuits of CMOS circuits are in series connected to each other so that the plurality of CMOS circuits can be driven at different voltages.

The above and other objects and attendant advantages of the present invention will be more readily apparent to those skilled in the art from a reading of the following detailed description in conjunction with the accompanying drawings which show preferred embodiments of the invention for illustration purpose only, but not for limiting the scope of the same in any way.

BRIEF DESCRIPTION OF THE DRAWINGS

FIG. 4a is a diagram of the circuit of another level shifter suitably employed in any one of the transistor circuits of the invention;

FIG. 4b is a chart which shows voltage wave forms at Points A and B in FIG. 4a;

FIG. 7 is a diagram of another embodiment of transistor circuit constructed in accordance with the present invention;

FIG. 8 is a diagram of the circuit of an amplifier suitably employed in any one of the embodiments of transistor circuit of the invention;

FIG. 9 is a graph which shows the relationship between input voltage, output voltage and through current of the transistor as shown in FIG. 8;

FIG. 10 is a diagram which shows the electrical connection when said amplifier of FIG. 8 is employed in conjunction with the transistor circuit in FIG. 7;

FIG. 11 is a diagram which shows an application of the transistor circuit in FIG. 10; and FIGS. 12a and 12b are diagrams of modifications of the amplifier as shown in FIG. 8.

DESCRIPTION OF THE PREFERRED EMBODIMENTS

Figure 1:
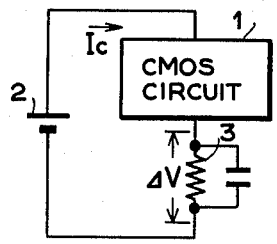
FIG. 1a, 1b and 1c are diagrams of prior art transistor circuits, respectively.
Figure 1:
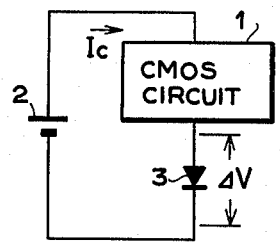
Figure 1:
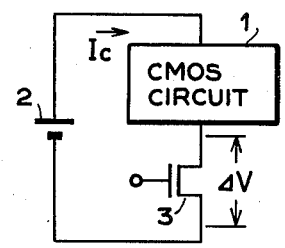
Figure 2:
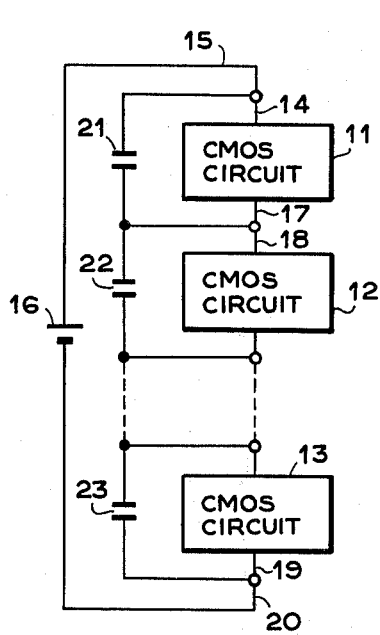
FIG. 2 is a diagram of one embodiment of transistor circuit constructed in accordance with the present invention.

The present invention will be now described referring to the accompanying drawings and more particularly, to FIG. 2 thereof in which the first embodiment of transistor circuit of the invention is shown. In FIG. 2, reference numerals 11, 12 and 13 denote CMOS circuits, respectively and the number of these CMOS circuits may vary, but should be at least two. The power circuits of these CMOS circuits are in series connected with each other so that the CMOS circuit 11 provides a first level, the CMOS circuit 12 provides a second level and the CMOS circuit 13 provides a third level, respectively. In other words, a line 14 leading to the higher potential power line of the power circuit associated with the first level CMOS circuit 11 is connected to a line 15 leading to the positive side of a DC power source such as a mercury cell or lithium cell while a line 17 leading to the lower potential line of the power circuit associated with the CMOS circuit 11 is connected to a line 18 leading to the higher potential power line of the power circuit associated with the second level CMOS circuit 12. The similar relationship exists between the second level CMOS circuit 12 and the third level CMOS circuit 13 and the same relationship is also applicable when one or more additional CMOS circuits are inserted between each two of these CMOS circuits. That is, in the illustrated embodiment of the invention, a line 19 leading to the lower potential power line of the power circuit associated with the lowest level CMOS circuit 13 is connected to a line 20 leading to the negative side of a DC power source 16.

Furthermore, the power circuits associated with the CMOS circuits 11, 12 and 13 have smoothing capacitors 21, 22 and 23 in parallel connected therewith, respectively. One terminal of each of the capacitors may be connected to the line 15 or 20.

The term "CMOS" circuit used herein means the circuit of an insulated gate type complementary metal oxide semiconductor.

In such a case, although it is necessary to distribute the different level circuits by taking the power ratio to be consumed by each of the different level circuits into consideration, the power ratio is not always necessary to be 1:1.

While the circuits at different levels are operating, assuming that current flow is Ic and the sum of the capacity of each node and the product of operation frequency is $\Sigma f_m \times c_m$, the voltage across the power source lines at each level will be expressed by:

$$v_n = \frac{Ic}{\Sigma f_m \times c_m} \quad (2)$$

And since $v_n$ affects on the operation rate of the circuit, it is necessary that the portion which requires a high frequency be distributed so as to have a small $\Sigma f_m \times c_m$ value.

Figure 3:
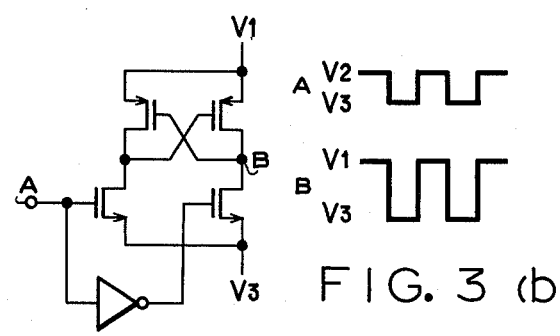
FIG. 3a is a diagram of the circuit of a level shifter suitably employed in any one of the transistor circuits of the invention.
FIG. 3b are charts which show voltage wave forms at Points A and B in FIG. 3a, respectively.
Figure 4:
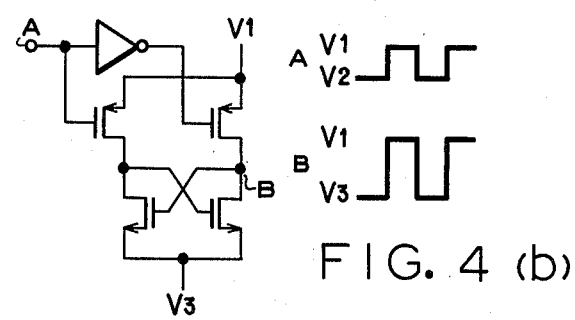

When signals are transmitted between the circuits at different levels, such signal transmission may be carried out by the employment of the level shifter as shown in FIGS. 3 and 4. FIG. 3a shows the shift mode from a lower level to a higher level and FIG. 3b shows operation voltage wave forms at Points A and B in FIG. 3a. FIG. 4a shows the shift mode from a higher level to a lower level and FIG. 4b shows operation voltage wave forms at Points A and B.

In the instance referred to hereinabove, the circuit at each level is required to consume a certain amount of power regardless of the conditions of the circuits at the other different levels. The reason is that when the circuit at a selected level is in completely deenergized position, no current flows through the circuit and thus, current also can not flow through the circuits at the other levels whereby the operation of all the circuits at the different levels is prohibited.

If the operation of the circuit at a particular level entirely relies upon the conditions of the circuits at the other levels, the circuit at the particular level is required to be provided with a DC current path at least at the initial stage of the operation of the circuit.

Figure 5:
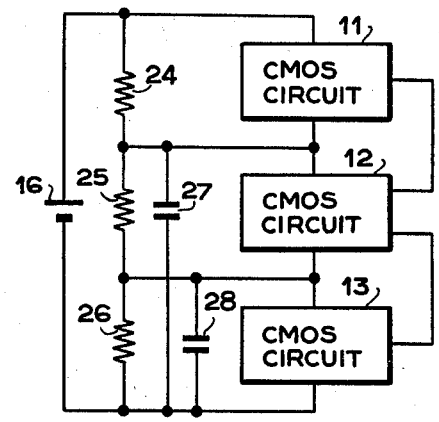
FIG. 5 is a diagram of another embodiment of transistor circuit constructed in accordance with the present invention.

FIG. 5 shows another embodiment of the transistor circuit of the invention in which the voltage at the power source 16 is divided by bleeder resistors 24, 25 and 26 and the divided output voltages are connected to smoothing capacitors 27 and 28 and supplied to the circuits 11, 12 and 13 at different levels as power sources for the circuits.

In other words, when each circuit initiates its operation, once, the circuit serves as the current path and the power source voltage at each level is determined by the abovementioned formula 2 without relying upon the bleeder resistor or resistors.

Figure 6:
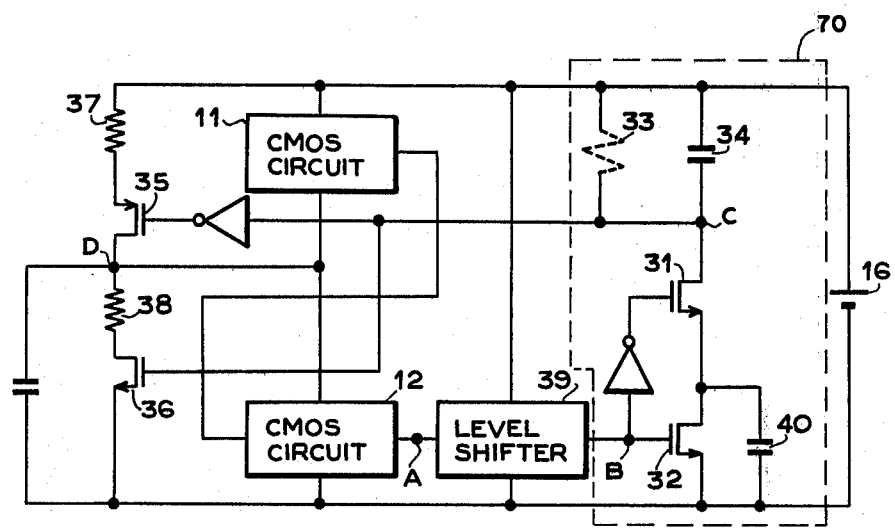
FIG. 6 is a diagram of another embodiment of transistor circuit constructed in accordance with the present invention.

FIG. 6 shows another embodiment of the transistor circuit of the invention in which the bleeder resistors are employed only at the initial stage of the operation of the transistor circuit and thereafter, the circuit is disconnected from the bleeder resistors by operation detection means 70 to thereby save power which would be otherwise consumed by the bleeder resistors.

Now assuming that the transistor circuit is in its deenergized state, no signal appears at Point A. Thus, Point B is either at Logic "1" or "0" state and either the transistor 31 or 32 is in OFF position. Since the capacitor 34 is charged through the leak resistor 33, Point C turns to "1" state and thus, both the transistors 35 and 36 turn "ON" and Point D is at the potential divided by the bleeder resistors 37 and 38. When the circuit 11 first initiates its operation and the circuit 12 then initiates its operation, signals "1" and "0" alternately appear at Point A. These signals are converted into levels by the level shifter 39 and appear at Point B. When Point B is in "0" level, the electric charge is discharged from Point C and applied to the capacitor 40. Then, when Point B turns to "1" state, the electric charge stored in the capacitor 40 is discharged. As the procedure is repeated, the potential at Point C finally turns to "0" state. Thus, the transistors 35 and 36 turn OFF and the bleeder circuit comprising resistors 37 and 38 is cut off. Therefore, once the transistor circuit operates, thereafter, no power is consumed by the bleeder resistors.

FIG. 7 shows another embodiment of transistor circuit of the invention. In this embodiment, when all the CMOS circuits are in their deenergized state, Point A is reduced in potential by the resistor 41 and the CMOS circuit 11 initiates its operation because the power source associated with the circuit is at a sufficiently high voltage. As the circuit 11 operates, the electric charge which has been discharged through the circuit is applied to the capacitor 42 and the potential at Point A rises. Since Point B is maintained at a low potential by the resistor 43, when the potential at Point A rises to a predetermined value, the CMOS circuit 12 initiates its operation. The electric charge which has been discharged through the CMOS circuit 12 is stored in the capacitor 44 to raise the potential at Point B to thereby cause the circuit 13 initiate its operation. When all the CMOS circuits initiate their operation, the resistors 41 and 43 may be of course disconnected from the circuits in a manner similar to that described in connection with the embodiment of FIG. 5.

FIG. 8 shows the arrangement of an amplifier circuit constituted by a CMOS inverter 51 and in this figure, reference numeral 52 denotes a feedback resistor and reference numeral 53 denotes a coupling capacitor. In this arrangement, by the presence of the coupling capacitor 53, since the DC component of the input signal is intercepted, the amplifier circuit can be applied signals at different levels thereto as the input and thus, the amplifier circuit can be employed in place of the level shifter as shown in FIG. 3. Furthermore, the characteristics of the amplifier circuit will be now described referring to FIG. 9. When no input signal is applied to the amplifier circuit, the circuit is biased at a substantially half of the power source voltage under Vin=Vout conditions and at this voltage value, both the transistors of the two channels which constitute the inverter turn ON and current Id flows through both the transistors. Thus, as mentioned hereinabove, the amplifier circuit can be employed as the necessary DC current path while all the CMOS circuits are operating. Once the transistors initiate their operation, if the input signal rises and drops at a sufficient high rate, the above-mentioned through current can be substantially neglected.

FIG. 10 shows another embodiment of transistor circuit of the invention in which the amplifier as shown in FIG. 8 is employed. The amplifier is inserted at least in the portion where signals from different levels are supplied to each of the circuits at the different levels. Each of these amplifiers performs the three functions such as the level shift, the DC current path at the initial operation stage and the buffer amplifier when the associated circuit is in operation. And since the circuit to which signals at different levels are supplied does not require the level shift, the amplifier having the coupling 53 (FIG. 8) eliminated therefrom may be inserted into a portion of the circuit.

FIG. 11 shows an application of the transistor circuit as shown in FIG. 10 and the embodiment is in the form of an electronic timepiece. In the embodiment of FIG. 11, the power source levels are shown by $v_d$, $v_x$ and $v_s$, respectively. The first level CMOS circuit 11 operates at the voltage of from the power sources $v_d$ and $v_x$ to function as an oscillator. The amplifier of the oscillator itself forms the circuit of the amplifier of FIG. 8. However, the coupling capacitor 61 may be eliminated from the first level CMOS circuit 11. The second level CMOS circuit 12 comprises a buffer amplifier 62 and a portion 63 which principally comprises a frequency divider. The second level circuit 12 operates at the power source voltages $V_x$ and $v_s$ and the initial DC current path is formed by the buffer amplifier 62. The third level circuit 64 operates at the power source voltages $v_d$ and $v_s$ and does not require the initial stage DC current path. The third level circuit 64 comprises a level shifter 65 and a portion 66 which principally consists of a drive circuit. The level shifter 65 may be the level shifter as shown in FIG. 6 or FIG. 8, but when the operation frequency is low, the coupling capacitor as shown in FIG. 8 is disadvantageous because the capacity of the coupling capacitor becomes great.

The power source voltage required by the third level circuit 64 varies somewhat depending upon the type of an display 67 employed. The display 67 may be a liquid crystal display, a display having a motor driven pointer or a LED display, for example. If the liquid crystal display is employed, the display effect will be enhanced when the drive voltage is set at a high value. If the display having a motor driven pointer is employed, since the display momentarily requires a large current, the conductance of the drive transistor should be high and thus, the drive transistor is preferably controlled at a high voltage. The LED display is required to satisfy the requirements called for in the first-mentioned two types of displays.

Referring now to FIGS. 12a and 12b which show amplifiers which have modified circuits adapted to apply a predetermined power source voltage to the amplifier inverter 51 in FIG. 8. Since the circuits of FIGS. 12a and 12b have the same functions as those which the amplifier in FIG. 8 has, these amplifiers can be employed for the same purpose as that for which the amplifier in FIG. 8 is employed.

As clear from the foregoing description of the invention, the transistor circuits of the invention effectively utilize power source voltages to apply a predetermined voltage to a plurality of CMOS circuits and thus, each of the circuits does not consume any excessive power. This means that the service life of a small size electronic circuit which employs a small size or small capacity cell as the power source such as an electronic timepiece or electronic pocket calculator can be substantially extended. Especially when a lithium cell which has a small capacity, but provides a high electromotive force is employed as the power source, the transistor circuit can exhibit excellent effects.

Although the invention has been described herein with reference to specific embodiments, many modifications and variations therein will readily occur to those skilled in the art. Accordingly, all such variations and modifications are included within the intended scope of the invention as defined by the following claims.

What is claimed is:

1. A complementary metal oxide semiconductor (CMOS) circuit for timepieces comprising:
    (a) a first CMOS circuit having an oscillator circuit;
    (b) a second CMOS circuit having a frequency divider circuit and connected to said first CMOS circuit;
    (c) a power supply source, said first and second CMOS circuits connected in series to said power supply source;
    (d) a smoothing capacitor connected between a junction of said first and second CMOS circuits and said power supply source; and
    (e) a D. C. current circuit connected between the junction of said first and second CMOS circuits and said power supply source.

2. The circuit of claim 1 wherein said D. C. current circuit includes a current cut-off means.

3. The circuit of claims 1 or 2 wherein said D. C. current circuit is comprised of a switching means connected in parallel with said smoothing capacitor for selectively connecting and disconnecting said smoothing capacitor.

4. The circuit of claim 3 further comprising an operation detection means connected to said switching means for controlling said switching means in response to the normal operation of said second CMOS circuit.

5. The circuit of claim 4 wherein said operation detection means is comprised of first and second transistors associated with said first and second CMOS circuits, a leak resistor, a first capacitor charged through said leak resistor, said leak resistor and said first capacitor associated with said first transistor and a second capacitor associated with said second transistor.

6. The circuit of claim 5 wherein said second CMOS circuit includes a CMOS inverter, a feedback resistor connected in parallel to said CMOS inverter, and a coupling capacitor connected in series to said CMOS inverter.

7. The circuit of claim 1 wherein said second CMOS circuit includes a CMOS inverter, a feedback resistor connected in parallel to said CMOS inverter, and a coupling capacitor connected in series to said CMOS inverter.

8. The circuit of claim 1 wherein said power supply source is comprised of a lithium cell.

* * * * *